US010879099B2

(12) United States Patent
Yang et al.

(10) Patent No.: US 10,879,099 B2
(45) Date of Patent: Dec. 29, 2020

(54) HUMIDITY CONTROL IN STORAGE DEVICE

(71) Applicant: Taiwan Semiconductor Manufacturing Co., Ltd., Hsinchu (TW)

(72) Inventors: Sheng-Chun Yang, Tainan (TW); Yi-Ming Lin, Tainan (TW); Chao-Hung Wan, Hsinchu (TW); Hsiu Hao Hsu, Hsinchu (TW); Guan Jung Chen, Hsinchu (TW); Po-Wei Liang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 136 days.

(21) Appl. No.: 16/238,001

(22) Filed: Jan. 2, 2019

(65) Prior Publication Data

US 2020/0058532 A1    Feb. 20, 2020

Related U.S. Application Data

(60) Provisional application No. 62/764,658, filed on Aug. 15, 2018.

(51) Int. Cl.
| B65D 85/30 | (2006.01) |
| H01L 21/673 | (2006.01) |
| C23C 16/455 | (2006.01) |
| C23C 16/44 | (2006.01) |
| H01L 21/67 | (2006.01) |

(52) U.S. Cl.
CPC .... H01L 21/67393 (2013.01); C23C 16/4412 (2013.01); C23C 16/45563 (2013.01); H01L 21/67017 (2013.01)

(58) Field of Classification Search
CPC ......... H01L 21/67393; H01L 21/67017; H01L 21/67; H01L 21/673; C23C 16/4412; C23C 16/45563; B65D 85/48
USPC ................................ 206/454, 710, 711, 832
See application file for complete search history.

(56) References Cited

U.S. PATENT DOCUMENTS

| 5,879,458 A * | 3/1999 | Roberson, Jr. .... H01L 21/67017 118/715 |
| 7,654,291 B2 * | 2/2010 | Miyajima ......... H01L 21/67772 141/63 |
| 8,286,674 B2 * | 10/2012 | Wang ................ H01L 21/67359 141/85 |
| 10,672,637 B2 * | 6/2020 | Glavan ............. H01L 21/67376 |

(Continued)

*Primary Examiner* — Luan K Bui
(74) *Attorney, Agent, or Firm* — Cooper Legal Group, LLC (57) ABSTRACT

A humidity-controlled storage device includes a plurality of panels configured to form an enclosed volume. A first panel of the plurality of panels includes inlet and outlet ports. The storage device further includes a purge system with a gas inlet pipe, a gas supply system, and a gas extraction system. The gas inlet pipe includes a nozzle and a cylindrical portion coupled to the inlet port. The gas supply system is configured to supply a purge gas to the gas inlet pipe. The gas inlet pipe is configured to output the purge gas into the enclosed volume in a direction that creates a circular or an oval gas flow pattern within the enclosed volume. The gas extraction system is coupled to the outlet port and is configured to extract the purge gas from the enclosed volume.

20 Claims, 4 Drawing Sheets

(56) References Cited

U.S. PATENT DOCUMENTS

| | | | |
|---|---|---|---|
| 2011/0114534 A1* | 5/2011 | Watson | H01L 21/67393 206/710 |
| 2013/0199446 A1* | 8/2013 | Alasaarela | C23C 16/458 118/715 |
| 2016/0141194 A1* | 5/2016 | Kirkland | H01L 21/67383 206/710 |
| 2016/0263591 A1* | 9/2016 | Woo | C25D 11/04 |
| 2019/0206708 A1* | 7/2019 | Woo | H01L 21/67393 |

* cited by examiner

HUMIDITY CONTROL IN STORAGE DEVICE

CROSS-REFERENCE TO RELATED APPLICATIONS

This application claims priority of U.S. Provisional Patent Application No. 62/764,658, titled "Humidity and Contamination Control in Substrate Storage Units," filed Aug. 15, 2018, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for contamination control in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

As used herein, the term "substantially" indicates the value of a given quantity varies by, for example, ±5% of the value.

Semiconductor wafers are subjected to different processes (e.g., wet etching, dry etching, ashing, stripping, metal plating, and/or chemical mechanical polishing) in different processing chambers during the fabrication of semiconductor devices. The wafers are typically transported and temporarily stored in batches in wafer storage devices during intervals between the different processes. The wafers of each batch are stacked vertically in the wafer storage devices and supported by support frames having multiple separate wafer shelves or slots within the wafer storage devices. These wafer storage devices, usually referred to as front-opening unified pods (FOUPs), need to provide a humidity- and contamination-controlled environment to maintain the integrity of the wafers and/or the fabricated layers on the wafers.

Moisture within the wafer storage devices from surrounding atmosphere can react with residual materials on the wafers from the different wafer processes and form defects in the fabricated layers on the wafers that can result in defective semiconductor devices, and hence, loss in production yield. For example, the wafers subjected to an etching process using tetrafluoromethane ($CF_4$) as the etchant can have cryptohalite (($NH_4$)$_2SiF_6$) as the residual material. Cryptohalite can react with moisture in the form of water vapor to produce ammonia ($NH_3$) and hydrofluoric acid (HF), which can remove portions of the fabricated layer materials from the wafers and form defects in the fabricated layers.

Besides moisture, contaminants in the form of particulates and/or chemical gases within the wafer storage devices can also result in defective wafers and hence, defective semiconductor devices. These contaminants, which can be from chemicals outgassed from the fabricated layer materials, adhere to the interior surfaces of the wafer storage devices and subsequently, transfer back to the wafers in the subsequent process steps as the wafers are removed and returned to the wafer storage devices.

The present disclosure provides example purge systems of wafer storage devices that are configured to achieve and maintain the desired moisture-content and/or contaminant-level throughout the interior volume of the wafer storage devices. In some embodiments, the example purge systems have purge gas inlet pipes that are configured to provide a circular flow pattern of the purge gas within the wafer storage devices. This circular flow of the purge gas allows substantially uniform removal of moisture and contaminants throughout the interior volume of the wafer storage devices. The purge gas inlet pipes can have one or more nozzles configured to direct the purge gas at angles with respect to a vertical axis (e.g., Z-axis) that create the circular or an oval flow pattern of the purge gas within the wafer storage devices. In some embodiments, rotation angles with respect to a horizontal axis (e.g., X-axis) on a horizontal plane (e.g., XY-plane) of the one or more nozzles can be adjustable manually or by using, for example, one or more actuators. The one or more nozzles can have adjustable openings to control the purge gas output from the one or more nozzles.

The example purge systems disclosed herein not only achieve and maintain the desired moisture-content and/or contaminant-level throughout the interior volume of the wafer storage devices, but also achieve lower relative humidity with an improved purging time. As a result, these example purge systems increase the throughput of processed wafers with improved purging time and increased production yield due to a decrease in defective wafers. In some embodiments, the relative humidity achieved by these example purge systems is improved by about 1% to about 7%. Such lower relative humidity is achieved in less than about 5 min (e.g., in about 4 min, 3 min, or 2 min) of purging time.

Figure 1A:
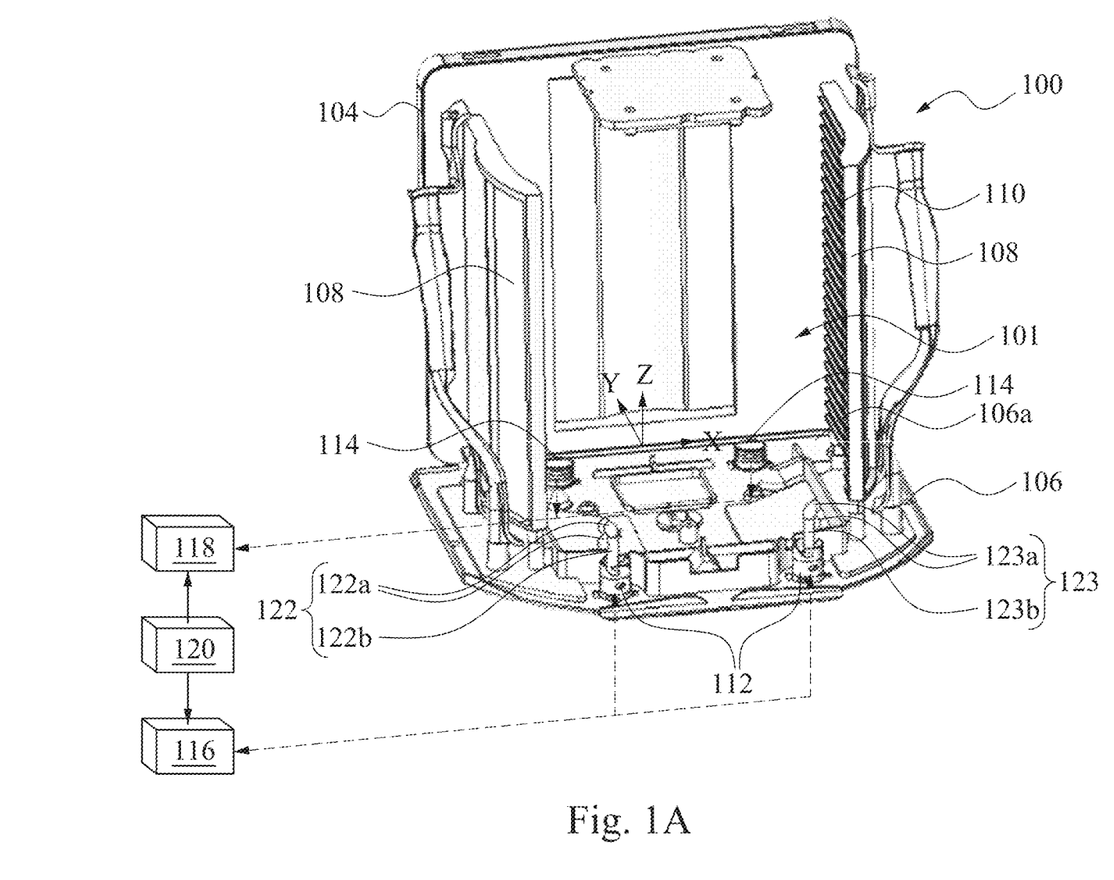
FIGS. 1A-1B illustrate isometric views of a semiconductor wafer storage device, in accordance with some embodiments.
Figure 1B:
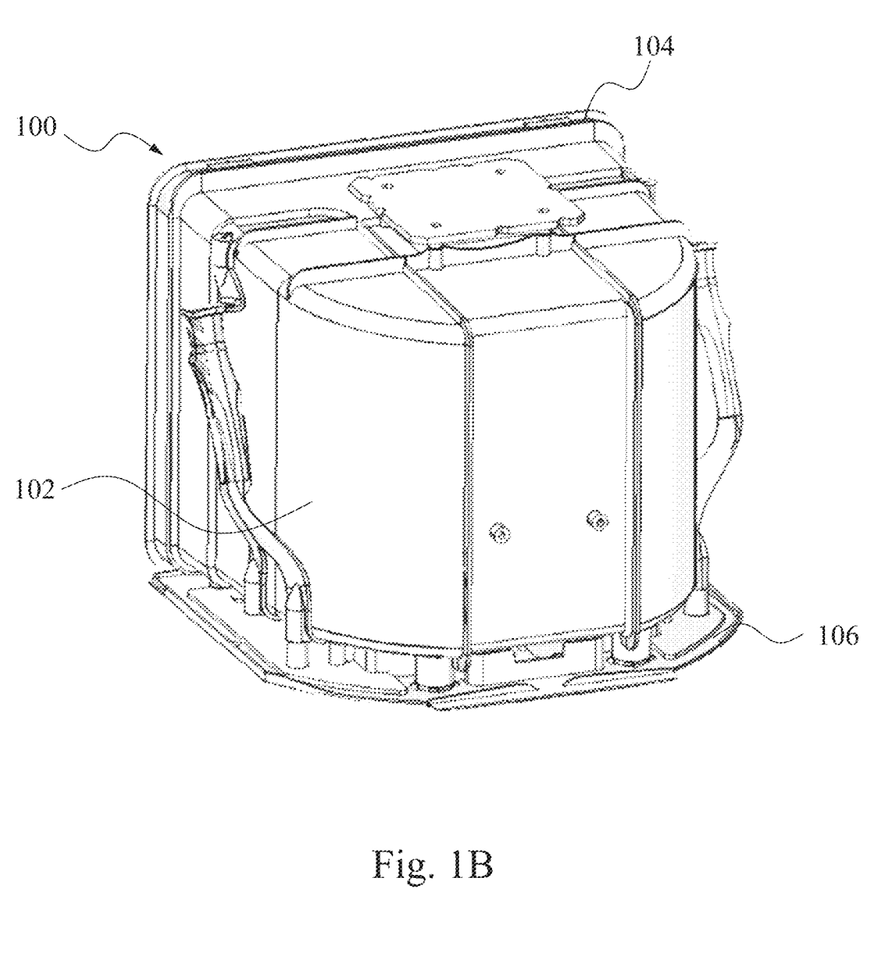

FIGS. 1A-1B illustrate isometric views of a wafer storage device 100 without and with a back cover 102, respectively, according to some embodiments. Wafer storage device 100 can be configured to transport and temporarily store a batch of wafers (not shown) that may be waiting to be processed for manufacturing semiconductor devices on them. Wafer storage device 100 can be configured to maintain a desired relative humidity (e.g., equal to or less than about 13%) and/or contaminant-level throughout the interior volume of wafer storage device 100 to protect the wafers and/or fabricated layers on the wafers from moisture and contaminants. As discussed above, moisture, if present above the desired relative humidity within wafer storage device 100, can react with residual materials on the wafers and form defects in the fabricated layers on the wafers that can result in defective semiconductor devices. Also, contaminants in the form of particulates and/or chemical gases, if present above the desired level within wafer storage device 100, can result in defective semiconductor devices.

In some embodiments, wafer storage device 100 includes back cover 102, a front panel 104, a base panel 106, and side panels 108 having horizontal protrusions (e.g., in the Y-direction) 110 extending outwardly from each of side panels 108 (illustrated only on one side panel). Back cover 102, front panel 104, base panel 106, and side panels 108 can be coupled to each other to form an enclosed volume 101 that holds a batch of wafers (not shown). Front panel 104 can be opened during loading and unloading of the batch of wafers, but can remain closed during purging of wafer storage device 100 to remove moisture and contaminants from inside wafer storage device 100.

The batch of wafers can be stacked vertically (e.g., in the Z-direction) in enclosed volume 101 and each wafer can be supported by one of horizontal protrusions 110 on each of side panels 108. Vertical spaces between adjacent protrusions 110 can be greater than the thickness of a wafer, such that each of the wafers can be stacked one over another. Each of horizontal protrusions 110 can be configured to support at least a portion of a wafer sufficiently to prevent warping or damage to the wafer. In some embodiments, horizontal protrusions 110 can be configured to support a peripheral edge portion on opposing sides of each wafer to minimize contact with layers fabricated on the wafers as the wafers are loaded into and unloaded from wafer storage device 100.

Base panel 106 can include purge gas inlet and outlet ports 112 and 114, respectively. Even though two inlet ports 112 and two outlet ports 114 are shown, base panel 106 can have less than or more than two inlet and outlet ports similar to respective inlet and outlet ports 112 and 114. Purge gas inlet ports 112 can be configured to allow purge gas to be supplied within enclosed volume 101 to purge out moisture and/or contaminants while a batch of wafers is stored within enclosed volume 101 of wafer storage device 100. The purge gas can be extracted from enclosed volume 101 through purge gas outlet ports 114. In some embodiments, the purge gas can include an inert gas such as, for example, nitrogen, argon, neon, or a combination thereof.

In some embodiments, back cover 102, front panel 104, base panel 106, side panels 108, and horizontal protrusions 110 can include polymeric materials such as transparent or opaque polycarbonate, polyvinyl chloride, or other suitable material. In some embodiments, one or more portions of back cover 102 can have semi-permeable membranes. The semi-permeable membranes can have microscopic pores with a maximum pore size of 0.01 μm in diameter. In some embodiments, the diameters of the pores are in the range between 0.005 μm to 0.01 μm. The size of the microscopic pores in the semi-permeable membranes can be small enough to block and prevent particulate contaminants from entering into wafer storage device 100, but can be large enough to allow corrosive gas molecules from within wafer storage device 100 to diffuse out.

Referring to FIG. 1A, wafer storage device 100 further includes a purge system with a purge gas supply system 116, a purge gas extraction system 118, a control system 120, and purge gas inlet pipes 122-123. Even though two purge gas inlet pipes 122-123 are shown, wafer storage device 100 can have one or more purge gas inlet pipes similar to pipes 122-123.

Purge gas supply system 116 can be configured to supply purge gas within enclosed volume 101 through purge gas inlet pipes 122-123 during a purging operation of wafer storage device 100. The black dashed lines from purge gas supply system 116 to purge gas inlet pipes 122-123 illustrate the purge gas supply lines. Purge gas can be supplied into enclosed volume 101 when a batch of wafers is loaded and enclosed within wafer storage device 100 to provide a humidity- and contamination-controlled environment.

Figure 2:
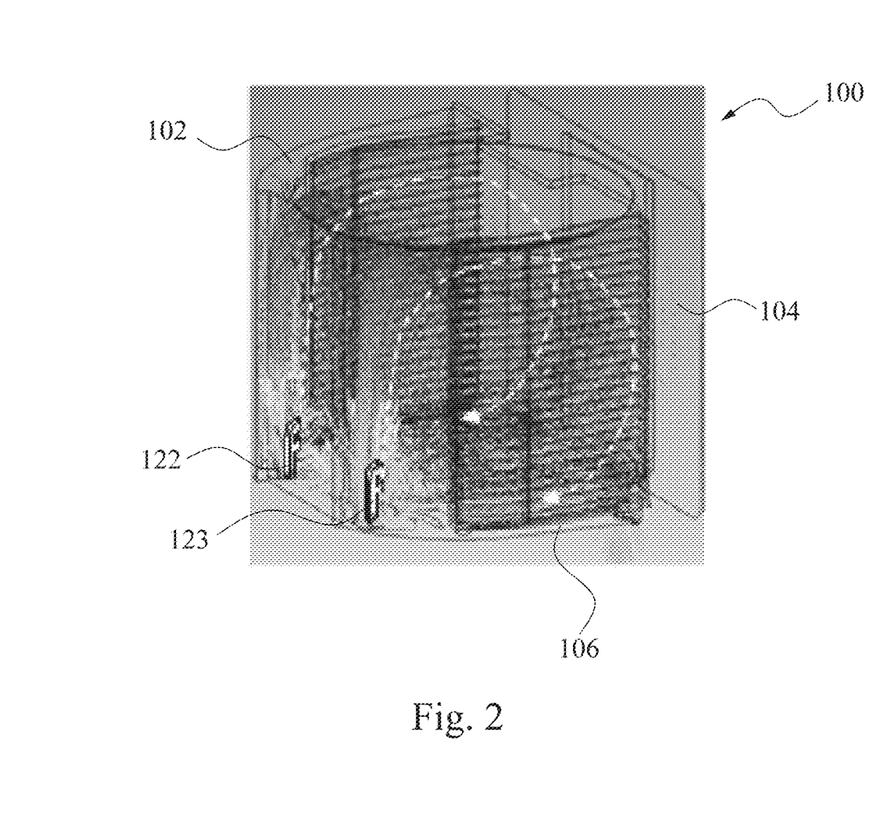
FIG. 2 illustrates a purge gas flow pattern in a semiconductor wafer storage device, in accordance with some embodiments.

Purge gas inlet pipes 122-123 can be coupled to gas supply system 116 through purge gas inlet ports 112. In some embodiments, purge gas inlet pipes 122-123 can include polymeric materials, such as transparent or opaque polycarbonate, polyvinyl chloride, or other suitable material for supplying inert gas. In some embodiments, purge gas inlet pipes 122-123 can have respective nozzles 122a-123a and cylindrical portions 122b-123b. Nozzles 122a-123 can be configured to output and direct the supplied purge gas in a direction such that a circular or an oval flow pattern can be created within enclosed volume 101. FIG. 2 illustrates such a circular or oval flow pattern of the purge gas within enclosed volume 101 of wafer storage device 100 during a purging operation. A batch of wafers within wafer storage device 100 during the purging operation is not shown in FIG. 2. Even though each of purge gas inlet pipes 122-123 are shown to have two nozzles 122a-123a, respectively, in FIGS. 1A and 2, each of purge gas inlet pipes 122-123 can have less than or more than two nozzles similar to nozzles 122a-123a.

Referring to FIG. 1A, nozzles 122a can output the purge gas in a first output direction and nozzles 123a can output the purge gas in a second output direction that is the same or different from the first direction. The first and second output directions can be at first and second angles, respectively, with a vertical axis such that the circular or an oval flow pattern is created within enclosed volume 101. The vertical axis Z-axis) can be along the vertical axes of symmetry (not shown) of cylindrical portions 122b-123b. The axes of symmetry of cylindrical portions 122b-123b can be perpendicular to a horizontal surface 106a of base panel 106. Horizontal surface 106a can have two intersecting sides that are along X- and Y-axis (shown in FIG. 1A), respectively. In some embodiments, the horizontal axes of symmetry of nozzles 122a-123a can be at the first and second angles with respect to the vertical axes of symmetry of cylindrical portions, respectively.

In some embodiments, the first and second angles can be equal to or different from each other. In some embodiments, the first and second angles can be between 90 degrees to 180 degrees (e.g., about 90 degrees, about 95 degrees, about 100 degrees, about 110 degrees, about 120 degrees, or about 130 degrees). In some embodiments, the first and second angles can be equal to or greater than 90 degrees.

Purge gas inlet pipes 122-123 can be further configured to rotate along the vertical axis in a horizontal plane (e.g., an X-Y plane and/or horizontal surface 106a) during the purging operation of wafer storage device 100. The rotation of purge gas inlet pipes 122-123 can be such that the first and second purge gas output directions are at first and second rotation angles with respect to the X-axis on the horizontal plane. The first and second rotation angles can be selected such that the first and second purge gas output directions are directed toward regions within enclosed volume 101 having relative humidity higher than the desired value. The selection of the first and second rotation angles can be based on signals from one or more humidity sensors (not shown) within wafer storage device 100. The one or more humidity sensors can provide humidity measurements of different regions within wafer storage device 100.

Additionally or alternatively, the selection of the first and second rotation angles can be based on purging time. At different time intervals of purging, purge gas inlet pipes 122-123 can be configured to rotate and angle the first and second purge gas output directions at different values of the first and second rotation angles. In some embodiments, the first and second rotation angles can be equal to or different from each other. In some embodiments, the first and second rotation angles can be between 0 degree and 180 degrees (e.g., about 40 degrees, about 50 degrees, about 60 degrees, about 70 degrees, about 75 degrees, about 80 degrees, about 85 degrees, about 90 degrees, about 95 degrees, about 100 degrees, about 110 degrees, about 120 degrees, about 130 degrees, or about 140 degrees). In some embodiments, the first and second rotation angles can be equal to about 90 degrees.

The configurations of purge gas inlet pipes 122-123 help to achieve a substantially uniform relative humidity within wafer storage device 100 with an improved purging time. The circular or oval flow pattern of the purge gas and/or the variable purge gas output directions used during the purging of wafer storage device 100 can allow a substantially uniform purging of moisture and contaminants from within wafer storage device 100.

In some embodiments, configurations of purge gas inlet pipes 122-123 reduce the relative humidity of enclosed volume 101 below about 13% in less than about 5 min of purging time. In some embodiments, wafer storage device 100 with purge gas inlet pipes 122-123 improves relative humidity by about 1% to about 7%. Such relative humidity values are achieved in less than about 5 min (e.g., in about 4 min, 3 min, or 2 min) of purging time. In some embodiments, wafer storage device 100 can achieve relative humidity of about 30%, 20%, or 10% in about 30 sec, 1 min, or 3 min, respectively, of purging time.

Referring to FIG. 1A, purge gas extraction system 118 can be coupled to purge gas outlet ports 114 and can be configured to extract the purge gas from within enclosed volume 101 through purge gas outlet ports 114. The extraction of the purge gas can be performed by an extraction pump of purge gas extraction system 118. The black dashed lines from purge gas outlet ports 114 to purge gas extraction system 118 illustrate the purge gas extraction lines.

Control system 120 can be coupled to purge gas supply and extraction systems 116 and 118. In some embodiments, control system 120 can be configured to control the operations of purge gas supply and extraction systems 116 and 118. In some embodiments, control system 120 can simultaneously activate and/or deactivate purge gas supply and extraction systems 116 and 118. In some embodiments, control system 120 can provide a time delay between the activation of purge gas supply and extraction systems 116 and 118 and/or the deactivation of purge gas supply and extraction systems 116 and 118.

The activation and/or deactivation of purge gas supply and extraction systems 116 and 118 can include controlling the purge gas supply to purge gas inlet pipes 122-123 and the operation of the extraction pump, respectively. In some embodiments, to activate and deactivate purge gas supply system 116, control system 120 can provide activation and deactivation signals that open and close a gas supply valve of purge gas supply system 116 to supply and block, respectively, the flow of purge gas to purge gas inlet pipes 122-123. In some embodiments, to activate and deactivate purge gas extraction system 118, control system 120 can provide activation and deactivation signals that activate and deactivate the extraction pump, and open and close a valve of purge gas extraction system 118 to allow and block, respectively, the flow of purge gas out of enclosed volume 101 through purge gas outlet ports 114.

The operations of purge gas supply and extraction systems 116 and 118 can be controlled by control system 120 based on one or more signals that indicate the presence of wafers within wafer storage device 100, the position of front panel 104, the pressure of purge gas within enclosed volume 101, the duration of purging, the relative humidity within wafer storage device 100, and/or the contamination level (e.g., corrosive gas level) within wafer storage device 100. In some embodiments, control system 120 can provide activation signals to purge gas supply and extraction systems 116 and 118 simultaneously or with a time delay in response to receiving sensor signals that indicate the presence of wafers within wafer storage device 100 and a closed position of front panel 104. Similarly, deactivation signals can be provided by control system 120 to purge gas supply and extraction systems 116 and 118 simultaneously or with a time delay in response to receiving sensor signals that indicate the absence of wafers from within wafer storage device 100 and the closed position of front panel 104. In some embodiments, deactivation signals can be provided by control system 120 to purge gas supply and extraction systems 116 and 118 simultaneously in response to receiving a sensor signal that indicates an open position of front panel 104. These sensor signals can be provided by one or more sensors (not shown) positioned on or within wafer storage device 100.

The activation and deactivation signals can be provided by control system 120 based on the duration of purging and/or relative humidity within enclosed volume 101. In some embodiments, control system 120 can schedule purge gas supply and extraction systems 116 and 118 to remain activated and/or deactivated for a desired time period when wafers are present within wafer storage device 101. However, purge gas supply and extraction systems 116 and 118 can be activated from a scheduled or unscheduled deactivated state when wafers are present in response to control system 120 receiving a sensor signal from a humidity and/or gas sensors indicating that the relative humidity and/or the contamination level, respectively, within enclosed volume 101 is above the desired value. Similarly, purge gas supply and extraction systems 116 and 118 can be deactivated from a scheduled or unscheduled activated state when wafers are present in response to control system 120 receiving a sensor signal from the humidity and/or gas sensors indicating that the relative humidity and/or the contamination level, respectively, within enclosed volume 101 is below the desired value.

Control system 120 can be further configured to rotate purge gas inlet pipes 122-123. In some embodiments, controls system 120 can have actuators coupled to purge gas inlet pipes 122-123 and configured to rotate purge gas inlet pipes 122-123. Control system 120 can provide actuating signals to the actuators to rotate purge gas inlet pipes 122-123 at the selected values of the first and second rotation angles as described above. The selected values can be determined by control system 120 in response to control system 120 receiving sensor signals from the humidity and/or gas sensors indicating the regions of enclosed volume 101 having relative humidity and/or contamination level above the desired value. In response to determining the selected values, control system 120 can provide actuating signals to the actuators.

Alternatively or in addition to providing actuating signals based on the sensor signals from the humidity and/or gas sensors, control system 120 can provide actuating signals to the actuators to rotate purge gas inlet pipes 122-123 at predetermined time intervals during the purging operation, according to some embodiments. The actuators can rotate purge gas inlet pipes 122-123 at predetermined values of the first and second rotation angles during these predetermined time intervals.

The above described method of purging in variable directions and in a circular or oval pattern within wafer storage device 100 using its purge system of purge gas supply system 116, purge gas extraction system 118, control system 120, and purge gas inlet pipes 122-123 leads to a substantially uniform and improved purging of moisture and/or contaminants from within wafer storage device 100.

Figure 3A:
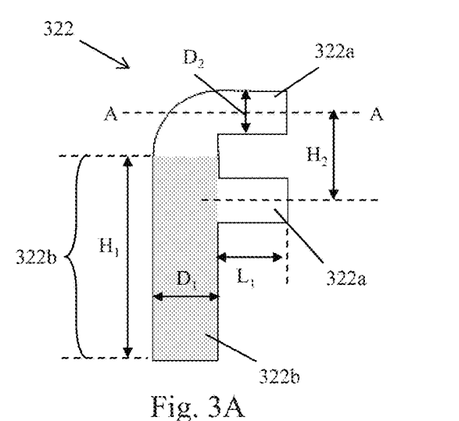
FIGS. 3A-3C, 4A-4B, and 5 illustrate cross-sectional views of a purge gas inlet pipe of a purge system of a semiconductor wafer storage device, in accordance with some embodiments.
Figure 3B:
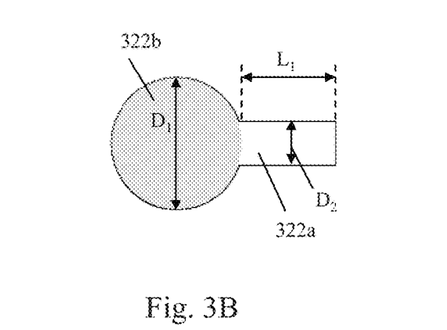
Figure 3C:
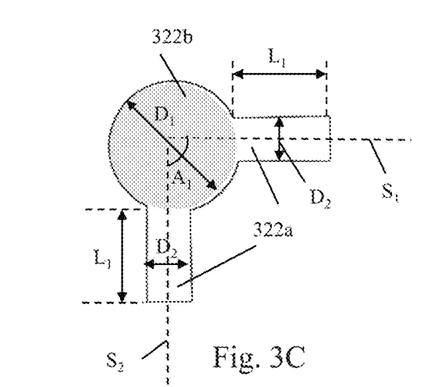

FIG. 3A illustrates a vertical cross-sectional view of a purge gas inlet pipe 322 that can represent purge gas inlet pipes 122 and/or 123 of wafer storage device 100. FIGS. 3B-3C illustrate different horizontal cross-sectional views of purge gas inlet pipe 322 along line A-A. The above discussion of purge gas inlet pipes 122 and/or 123 applies to purge gas inlet pipe 322, unless mentioned otherwise. Purge gas inlet pipe 322 can include nozzles 322a and cylindrical portion 322b (shaded portion). The above discussion of nozzles 122a and cylindrical portion 122b applies to nozzles 322a and cylindrical portion 322b, respectively, unless mentioned otherwise. The vertical cross-section is along the diameter of cylindrical portion 322b.

Cylindrical portion 322b can have a vertical dimension (e.g., height) $H_1$ ranging from about 30 mm to about 50 mm, an outer diameter $D_1$ ranging from about 5 mm to about 10 mm, and an inner diameter (not shown) ranging from about 4 mm to about 9 mm. In some embodiments, $H_1$ can be about 40 mm, $D_1$ can be about 7 mm, and inner diameter can be about 6 mm. Each of nozzles 322.a extending from cylindrical portion 322b can have a horizontal dimension (e.g., length) $L_1$ ranging from about 3 mm to about 8 mm, an outer diameter $D_2$ ranging from about 5 mm to about 10 mm, and an inner diameter (not shown) ranging from about 4 mm to about 9 mm. In some embodiments, $L_1$ can be about 5 mm, $D_2$ can be about 7 mm, and inner diameter of nozzles 322a can be about 6 mm. In some embodiments, $D_1$ and $D_2$ are equal to or different from each other. Nozzles 322a can have a vertical distance $H_2$ between their horizontal axes of symmetry along the X-axis. This vertical distance $H_2$ can range from about 5 mm to about 15 mm. In some embodiments, $H_2$ can be about 11 mm or 12 mm.

In some embodiments, purge gas inlet pipe 322 can have a horizontal cross-sectional view along line A-A similar to the view in FIG. 3B when purge gas inlet pipe 322 has one nozzle 322a extending from cylindrical portion 322b per horizontal plane (e.g. X-Y plane). However, in some embodiments, purge gas inlet pipe 322 can have a horizontal cross-sectional view along line A-A similar to the view in FIG. 3C when purge gas inlet pipe 322 have two nozzles 322a extending from cylindrical portion 322b per horizontal plane. The two nozzles 322a on the same horizontal plane can have a common horizontal plane of symmetry along the X-Y plane, but different horizontal axes of symmetry $S_1$ and $S_2$ as shown in FIG. 3C. In some embodiments, the two nozzles 322a of FIG. 3C can be radially separated from each other by an angle $A_1$ ranging from about 40 degrees to about 90 degrees between their axes of symmetry $S_1$ and $S_2$.

Figure 4A:
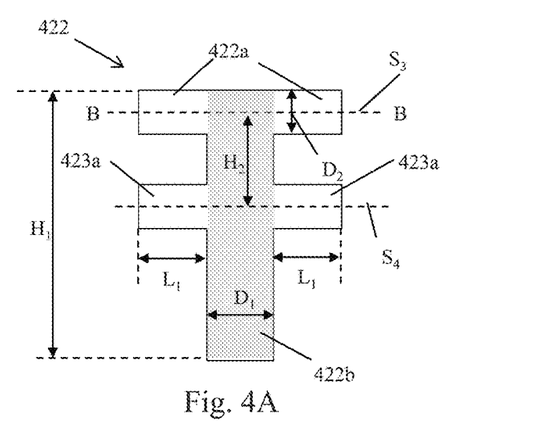
Figure 4B:
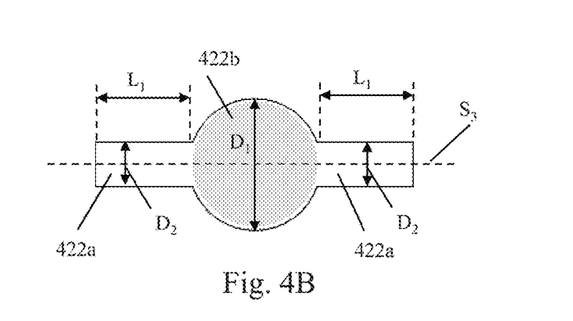

FIG. 4A illustrates a vertical cross-sectional view of a purge gas inlet pipe 422 that can represent purge gas inlet pipes 122 and/or 123 of wafer storage device 100. FIG. 4B illustrates a horizontal cross-sectional view of purge gas inlet pipe 422 along line B-B. The above discussion of purge gas inlet pipes 122 and/or 123 applies to purge gas inlet pipe 422, unless mentioned otherwise. Purge gas inlet pipe 422 can include two pairs of nozzles 422a-423a and cylindrical portion 422b (shaded portion). The above discussion of nozzles 122a and cylindrical portion 122b applies to nozzles 422a-423a and cylindrical portion 422b, respectively, unless mentioned otherwise. The vertical cross-section is along the diameter of cylindrical portion 422b.

Each pair of nozzles 422a-423a can have a common horizontal axis of symmetry $S_3$ and $S_4$, respectively. In some embodiments, the pair of nozzles 422a-423a can be vertically separated from each other by the vertical dimension $H_2$ between their horizontal axes of symmetry$_3$ and $S_4$. The dimensions of nozzles 422a-423a and cylindrical portion 422b can be similar to that of nozzle 322a and cylindrical portion 322b, respectively. FIG. 4B shows a horizontal cross-sectional view of nozzles 422a having the common horizontal axis of symmetry. $S_3$. Each nozzle of nozzles 422a can extend in opposite direction with respect to each other.

Figure 5:
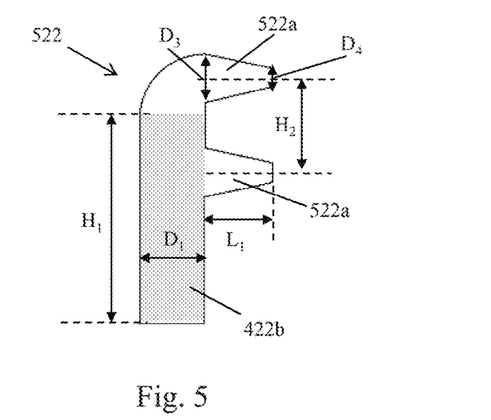

FIG. 5 illustrates a vertical cross-sectional view of a purge gas inlet pipe 522 that can represent purge gas inlet pipes 122 and/or 123 of wafer storage device 100. The above discussion of purge gas inlet pipe 322 applies to purge gas inlet pipe 522, unless mentioned otherwise. Nozzles 522a of purge gas inlet pipe 522 can have a tapered cross-section, where opposing ends of nozzles 522a have different outer diameters $D_3$ and $D_4$. The outer diameter $D_3$ can be larger than the outer diameter $D_4$.

The above system and method of purging have been described with reference to a wafer storage device. However, this system and method of purging may be implemented in any type of storage device that requires a humidity-controlled environment for storing its contents. In some embodiments, storage devices for storing humidity-sensitive products such as, for example, photosensitive chemicals, polymers, pharmaceuticals, reagents, wafer handling tools, integrated circuit (IC) chips, photomasks, or reticles may implement a purge system similar to that of wafer storage device 100 discussed above.

The above embodiments describe purge systems of wafer storage devices (e.g., wafer storage device 100) that are configured to achieve and maintain a desired moisture-content and/or contaminant-level throughout interior volumes of the wafer storage devices. In some embodiments, the purge systems have purge gas inlet pipes (e.g., purge gas inlet pipes 122-123) configured to provide a circular or oval flow pattern of the purge gas within the wafer storage devices. Such patterned circulation of the purge gas allow substantially uniform removal of moisture and contaminants throughout the interior volume of the wafer storage devices. The purge gas inlet pipes may have one or more nozzles (e.g., nozzles 122a-123a) configured to direct the purge gas at angles with respect to a vertical axis (e.g., Z-axis) that create the circular flow pattern of the purge gas within the wafer storage devices. In some embodiments, rotation angles with respect to a horizontal plane (e.g., X-Y-plane) and/or heights of the one or more nozzles may be adjustable manually or by using, for example, one or more actuators of a control system (e.g., control system 120). The one or more nozzles may have adjustable openings to control the purge gas output from the one or more nozzles.

The purge systems disclosed herein not only achieve and maintain the desired moisture-content and/or contaminant-level throughout the interior volume (e.g., enclosed volume 101) of the wafer storage devices, but also achieve a desired relative humidity with an improved purging time. In some embodiments, the disclosed purge systems reduce the relative humidity of wafer storage devices below about 13% in less than about 5 min of purging time. In some embodiments, the relative humidity achieved by the disclosed purge systems is improved by about 1% to about 7%. Such relative humidity values are achieved in less than about 5 min (e.g., in about 4 min, 3 min, or 2 min) of purging time. In some embodiments, these purge systems achieve relative humidity of about 30% 20%, or 10% in about 30 sec, 1 min, or 3 min, respectively, of purging time.

In some embodiments, a storage device includes a plurality of panels configured to form an enclosed volume, where a first panel of the plurality of panels includes inlet and outlet ports. The storage device further includes a purge system with a gas inlet pipe, a gas supply system, and a gas extraction system. The gas inlet pipe includes a nozzle and a cylindrical portion coupled to the inlet port. The gas supply system is configured to supply a purge gas to the gas inlet pipe. The gas inlet pipe is configured to output the purge gas into the enclosed volume in a direction that creates a circular or an oval gas flow pattern within the enclosed volume. The gas extraction system is coupled to the outlet port and is configured to extract the purge gas from the enclosed volume.

In some embodiments, a semiconductor wafer storage device includes a panel with first and second gas inlet ports, first and second gas inlet pipes, a gas supply system, and a control system. The first and second gas inlet pipes include first and second cylindrical portions and first and second nozzles extending horizontally from the first and second cylindrical portions, respectively. The first and second gas inlet pipes are respectively coupled to the first and second gas inlet ports. The gas supply system is configured to supply a purge gas to the first and second gas inlet pipes. The control system is configured to rotate the first and second gas inlet pipes within the semiconductor wafer storage device.

In some embodiments, a humidity-controlled storage device includes a panel having gas inlet and outlet ports, a gas inlet pipe, a gas supply system, and a gas extraction system. The gas inlet pipe includes a cylindrical portion and first and second nozzles extending horizontally from the cylindrical portion. The gas inlet pipe is coupled to the inlet port. The gas supply system is configured to supply a purge gas to the gas inlet pipe and to output the purge gas into the humidity-controlled storage device in a direction that creates a circular or an oval gas flow pattern within the humidity-controlled storage device. The gas extraction system is coupled to the outlet port and is configured to extract the purge gas from the humidity-controlled storage device.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A storage device comprising:
   a plurality of panels configured to form an enclosed volume, wherein a first panel of the plurality of panels comprises an inlet port and an outlet port;
   a purge system comprising:
      a gas inlet pipe with a nozzle and a cylindrical portion coupled to the inlet port;
      a gas supply system configured to supply a purge gas to the gas inlet pipe, wherein the gas inlet pipe is configured to output the purge gas into the enclosed volume through the nozzle; and a gas extraction system coupled to the outlet port and configured to extract the purge gas from the enclosed volume; and a control system configured to activate the gas supply system and the gas extraction system based on a sensor signal that indicates a position of a second panel of the plurality of panels.

2. The storage device of claim 1, wherein the gas inlet pipe extends vertically from the inlet port into the enclosed volume.

3. The storage device of claim 1, wherein an angle between the nozzle and the cylindrical portion is between about 90 degrees and about 180 degrees.

4. The storage device of claim 1, wherein:
the cylindrical portion comprises a vertical dimension between about 30 mm and about 50 mm,
the cylindrical portion comprises a diameter between about 5 mm and about 10 mm,
the nozzle comprises a horizontal dimension between about 3 mm and about 8 mm, and
the nozzle comprises a diameter between about 5 mm and about 10 mm.

5. The storage device of claim 1, wherein the control system comprises an actuator configured to rotate the gas inlet pipe within the enclosed volume during a purging operation of the storage device.

6. The storage device of claim 1, wherein the control system comprises an actuator configured to rotate the gas inlet pipe within the enclosed volume based on a second sensor signal that indicates a region within the enclosed volume with a relative humidity higher than a desired value.

7. The storage device of claim 1, wherein the purge system is configured to provide a relative humidity between about 13% and about 10% within the enclosed volume in a period of purging time between about 5 min and about 3 min.

8. The storage device of claim 1, wherein the purge system is configured to provide a relative humidity of about 10% within the enclosed volume in about 3 min of purging time.

9. A semiconductor wafer storage device comprising:
a panel with a first gas inlet port and a second gas inlet port;
a first gas inlet pipe with a first cylindrical portion and a first nozzle extending horizontally from the first cylindrical portion, wherein the first gas inlet pipe is coupled to the first gas inlet port;
a second gas inlet pipe with a second cylindrical portion and a second nozzle extending horizontally from the second cylindrical portion, wherein the second gas inlet pipe is coupled to the second gas inlet port;
a gas supply system configured to supply a purge gas to the first gas inlet pipe and the second gas inlet pipe; and
a control system comprising an actuator configured to rotate at least one of the first gas inlet pipe or the second gas inlet pipe within the semiconductor wafer storage device based on a sensor signal that indicates a region within the semiconductor wafer storage device with a relative humidity higher than a desired value.

10. The semiconductor wafer storage device of claim 9, wherein:
the first gas inlet pipe is configured to output the purge gas in a first direction,
the second gas inlet pipe is configured to output the purge gas in a second direction, and
the first direction is different from the second direction.

11. The semiconductor wafer storage device of claim 9, wherein:
the control system is configured to rotate the first gas inlet pipe by a first rotation angle with respect to a horizontal axis,
the control system is configured to rotate the second gas inlet pipe by a second rotation angle with respect to the horizontal axis, and
the first rotation angle is different from the second rotation angle.

12. The semiconductor wafer storage device of claim 9, wherein the control system is configured to activate the gas supply system based on the sensor signal.

13. The semiconductor wafer storage device of claim 9, wherein:
the first gas inlet pipe extends vertically from the first gas inlet port into the semiconductor wafer storage device, and
the second gas inlet pipe extends vertically from the second gas inlet port into the semiconductor wafer storage device.

14. The semiconductor wafer storage device of claim 9, wherein the first gas inlet pipe comprises a second nozzle.

15. A storage device comprising:
a plurality of panels configured to form an enclosed volume, wherein a first panel of the plurality of panels comprises an inlet port and an outlet port;
a purge system comprising:
a gas inlet pipe with a nozzle and a cylindrical portion coupled to the inlet port;
a gas supply system configured to supply a purge gas to the gas inlet pipe, wherein the gas inlet pipe is configured to output the purge gas into the enclosed volume through the nozzle; and
a gas extraction system coupled to the outlet port and configured to extract the purge gas from the enclosed volume; and
a control system comprising an actuator configured to rotate the gas inlet pipe within the enclosed volume based on a sensor signal that indicates a region within the enclosed volume with a relative humidity higher than a desired value.

16. The storage device of claim 15, wherein an angle between the nozzle and the cylindrical portion is between about 90 degrees and about 180 degrees.

17. The storage device of claim 15, wherein:
the gas inlet pipe comprises a second nozzle, and
the nozzle and the second nozzle have a common horizontal axis of symmetry.

18. The storage device of claim 15, wherein:
the nozzle has a tapered cross-section.

19. The storage device of claim 15, wherein:
the gas inlet pipe comprises a second nozzle,
the nozzle has a first horizontal axis of symmetry, and
the second nozzle has a second horizontal axis of symmetry different than the first horizontal axis of symmetry.

20. The storage device of claim 15, wherein the control system is configured to activate the gas supply system based on a second sensor signal that indicates a position of a second panel of the plurality of panels.

* * * * *